United States Patent
Chang et al.

(10) Patent No.: US 10,340,003 B1
(45) Date of Patent: Jul. 2, 2019

(54) INPUT-PATTERN AWARE REFERENCE GENERATION SYSTEM AND COMPUTING-IN-MEMORY SYSTEM INCLUDING THE SAME

(71) Applicant: NATIONAL TSING HUA UNIVERSITY, Hsinchu (TW)

(72) Inventors: Meng-Fan Chang, Taichung (TW); Wei-Hao Chen, Tuku Township (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 16/029,350

(22) Filed: Jul. 6, 2018

(51) Int. Cl.
| | |
|---|---|
| *G11C 11/00* | (2006.01) |
| *G11C 13/00* | (2006.01) |
| *G11C 11/56* | (2006.01) |
| *G11C 7/12* | (2006.01) |
| *G06F 7/544* | (2006.01) |

(52) U.S. Cl.
CPC .......... *G11C 13/004* (2013.01); *G06F 7/5443* (2013.01); *G11C 7/12* (2013.01); *G11C 11/5642* (2013.01); *G11C 13/0026* (2013.01); *G11C 13/0028* (2013.01); *G11C 2013/0054* (2013.01)

(58) Field of Classification Search
CPC ....... G11C 16/08; G11C 8/10; G11C 11/5621; G11C 11/5642; G11C 16/0433; G11C 29/832; G11C 2211/5641; G11C 11/5628; G11C 11/5635; G11C 11/5678; G11C 13/0004; G11C 16/10
USPC ............ 365/185.03, 185.15, 185.23, 185.11, 365/185.14, 185.18, 185.22, 207, 185.21, 365/185.09, 185.2, 230.03, 185.02
See application file for complete search history.

(56) References Cited

U.S. PATENT DOCUMENTS

2005/0024956 A1* 2/2005 Tran ................. G11C 29/027
365/200

* cited by examiner

*Primary Examiner* — Thong Q Le
(74) *Attorney, Agent, or Firm* — Muncy, Geissler, Olds & Lowe, P.C.

(57) ABSTRACT

An input-pattern aware reference generation system for a memory cell array having a plurality of word lines crossing a plurality of bit lines includes an input counting circuit, a reference array, and a reference word line control circuit. The input counting circuit receives the input signal of the memory cell array, discovers input activated word lines according to the input signal and generates a number signal representing a number of the input activated word lines. The reference array includes a plurality of reference memory cells storing a predetermined set of weights. The reference word line control circuit is electrically connected between the input counting circuit and the reference array. Moreover, the reference word line control circuit controls the reference array to generate a plurality of reference signals being able to distinguish candidates of the computational result of the bit lines in the memory cell array.

14 Claims, 12 Drawing Sheets

| RWL | RBL7 | RBL6 | RBL5 | RBL4 | RBL3 | RBL2 | RBL1 | RBL0 |
|---|---|---|---|---|---|---|---|---|
| 0 | L | L | L | L | L | L | L | H |
| 1 | L | L | L | L | L | L | H | H |
| 2 | L | L | L | L | L | H | H | H |
| 3 | L | L | L | L | H | H | H | H |
| 4 | L | L | L | H | H | H | H | H |
| 5 | L | L | H | H | H | H | H | H |
| 6 | L | H | H | H | H | H | H | H |
| 7 | H | H | H | H | H | H | H | H |
| 8 | H | H | H | H | H | H | H | H |
| 9 | H | H | H | H | H | H | H | H |
| - | H | H | H | H | H | H | H | H |
| - | H | H | H | H | H | H | H | H |
| m-1 | H | H | H | H | H | H | H | H |
| m | H | H | H | H | H | H | H | H |

L:LRS
H:HRS

| $INP_i$ | $W_{ij}$ | $INP_i*W_{ij}$ | $I_{mc\_ij}$ |
|---|---|---|---|
| 0 | 0(HRS) | 0 | 0 |
| 0 | 1(LRS) | 0 | 0 |
| 1 | 0(HRS) | 0 | $I_{HRS}$ ← Leakage current |
| 1 | 1(LRS) | 1 | $I_{LRS}$ |

INPUT-PATTERN AWARE REFERENCE GENERATION SYSTEM AND COMPUTING-IN-MEMORY SYSTEM INCLUDING THE SAME

BACKGROUND OF THE INVENTION

Field of the Invention

The present invention relates to an input-pattern aware reference generation system and a computing-in-memory (CIM) system including the input-pattern aware reference generation system.

Description of the Related Art

In the computing-in-memory (CIM) approach, a large number of word lines are activated at the same time and memory cell currents are summed up on bit lines. However, taking resistive random-access memory (ReRAM) for example, the leakage currents of high resistive state (HRS) and process variations lead to a high error rate in the computing-in-memory (CIM) approach such as the MAC (multiply-and-accumulate) value computation.

In the conventional MAC value computation, reference currents for distinguishing the bit line currents of the memory cell array are fixed with the same intervals. However, under the existence of the leakage current, the fixed reference currents cannot properly distinguish the bit line currents of the memory cell array with the same intervals.

In view of the aforementioned problem, a system for generating input-pattern aware reference currents and/or input-pattern aware reference voltages is need. Therefore, the present disclosure provides an input-pattern aware reference generation system to generate reference signals being able to distinguish candidates of the computational result of the bit lines in the memory cell array. In this case, the sensing margin is increased and the sensing yield is improved.

SUMMARY OF THE INVENTION

In view of the aforementioned problems of the prior art, one objective of the present invention provides an input-pattern aware reference generation system for a memory cell array having a plurality of word lines crossing a plurality of bit lines, the plurality of word lines being selectively activated by an input signal such that each of the plurality of bit lines generates a computational result of multiply-and-accumulate (MAC) computation, the system including: an input counting circuit, receiving the input signal of the memory cell array, discovering input activated word lines according to the input signal and generating a number signal representing a number of the input activated word lines; a reference array, including a plurality of reference memory cells storing a predetermined set of weights; and a reference word line control circuit, electrically connected between the input counting circuit and the reference array, the reference word line control circuit controlling the reference array to generate a plurality of reference signals being able to distinguish candidates of the computational result of the bit lines in the memory cell array according to the number signal.

Preferably, the reference array may include a plurality of reference bit lines, and the predetermined set of weights is arranged such that the plurality of reference bit lines each represents a possible MAC computational result of a combination of 0's and 1's stored in each memory cell of the memory cell array.

Preferably, the plurality of reference signals may be generated according to outputs of the reference bit lines.

Preferably, the plurality of reference signals each may represent an average of two neighboring outputs of the reference bit lines.

Preferably, the reference array may include one or more reference sub-array and each of the reference sub-arrays may include m reference word lines crossing n reference bit lines; wherein when the number signal is q, q reference word lines among m reference word lines are activated according to the input signal, the n reference bit lines generate at least q+1 MAC computational results corresponding to combinations of r 1's and s 0's, wherein m, n, and q are integers, 0≤r, s≤q, and r+s=q.

Preferably, the reference signals may be voltage signals or current signals.

Preferably, the memory cell array may be a non-volatile memory (NVM) used in a computing-in-memory (CIM) application.

Another objective of the present invention provides a system for computing-in-memory approach including: a memory cell array, the input-pattern aware reference generation circuit, a sense amplifier, a reference selecting circuit and a sense amplifier output latch; the memory cell array having a plurality of word lines crossing a plurality of bit lines, the plurality of word lines being selectively activated by an input signal such that each of the plurality of bit lines generates a computational result of multiply-and-accumulate (MAC) computation; the sense amplifier being electrically connected to the memory cell array; the reference selecting circuit being electrically connected between the reference array and the sense amplifier, the reference selecting circuit selecting and transmitting at least one of the reference signals to the sense amplifier; and the sense amplifier output latch being electrically connected between the sense amplifier and the reference selecting circuit, the sense amplifier output latch matching the computational result of the bit lines with the candidates and outputting a matched computational result of the bit lines.

Preferably, the reference array may include a plurality of reference bit lines, and the predetermined set of weights is arranged such that the plurality of reference bit lines each represents a possible MAC computational result of a combination of 0's and 1's stored in each memory cell of the memory cell array.

Preferably, the plurality of reference signals may be generated according to outputs of the reference bit lines.

Preferably, the plurality of reference signals each may represent an average of two neighboring outputs of the reference bit lines.

Preferably, the reference array may include one or more reference sub-array and each of the reference sub-arrays may include m reference word lines crossing n reference bit lines; wherein when the number signal is q, q reference word lines among m reference word lines are activated according to the input signal, the n reference bit lines generate at least q+1 MAC computational results corresponding to combinations of r 1's and s 0's, wherein m, n, and q are integers, 0≤r, s≤q, and r+s=q.

Preferably, the reference signals may be voltage signals or current signals.

In accordance with the above description, the input-pattern aware reference generation system may properly distinguish candidates of the CIM computational result of the bit lines in the memory cell array with different signals and further increase the sensing margin and improve the sensing yield.

BRIEF DESCRIPTION OF THE DRAWINGS

FIG. 2(B) illustrates the concept of the MACV computation.

DETAILED DESCRIPTION OF THE PREFERRED EMBODIMENTS

The advantages, features and technical methods of this invention will be described in detail in order to be understood easier. Moreover, the present invention may be realized in different form and should not be limited to the embodiments described here. On the contrary, the provided embodiments make the disclosure more clear and define the scope of this invention entirely and completely. Further, the present invention is only defined according to the attached claims.

Figure 1:
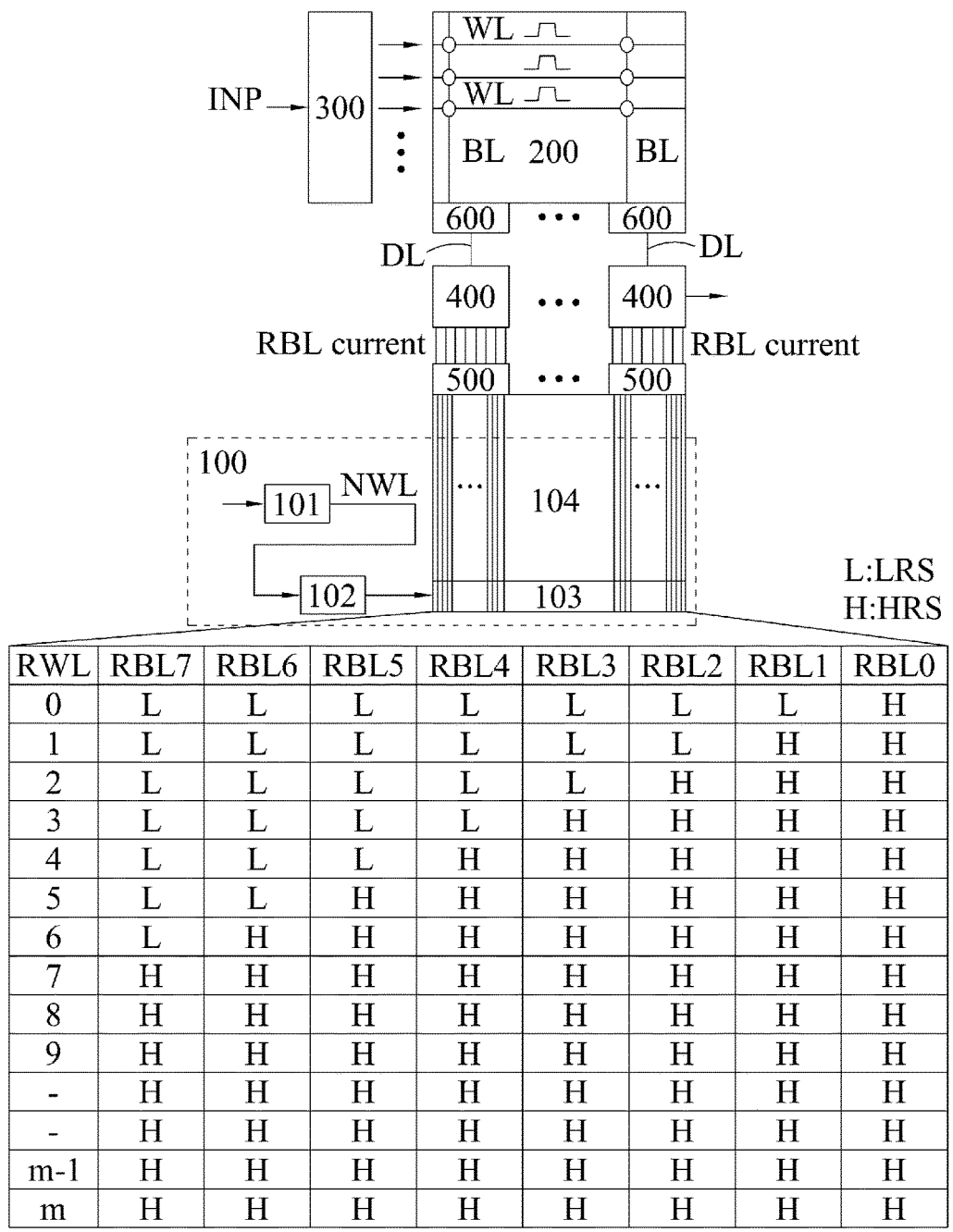
FIG. 1 depicts the input-pattern aware reference generation system according to an embodiment of the present disclosure.

FIG. 1 depicts the input-pattern aware reference generation system according to an embodiment of the present invention. The input-pattern aware reference generation system 100 includes the input counting circuit 101, the reference word line control circuit 102 and the reference array 103. The input-pattern aware reference generation system 100 is configured to generate reference signals being able to distinguish candidates of the computational MAC (multiply-and-accumulate) result of each bit line BL of the memory cell array 200. The memory cell array 200 includes a plurality of word lines WL (row) and bit lines BL (column) crossing the word lines WL. The memory cell array 200 may be, for example, RRAM, MRAM, PCM, etc. The word line driver 300 inputs the input signal INP to determine which word lines of the memory cell array 200 to be activated.

Figure 2A:
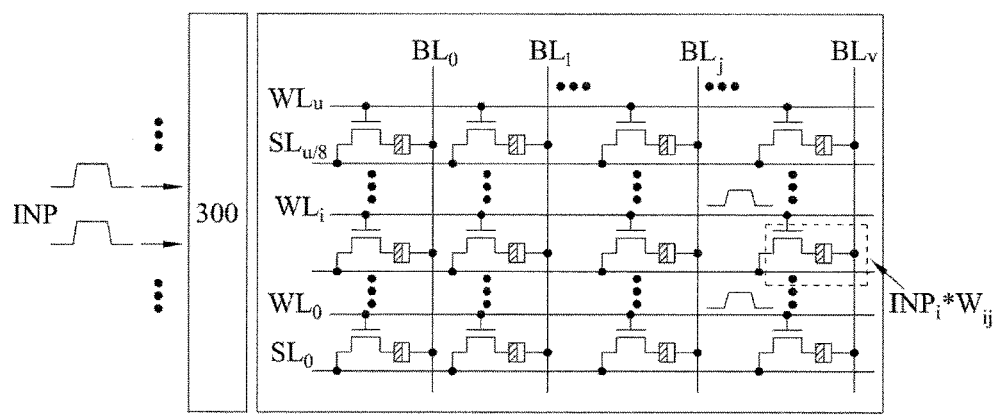
FIG. 2(A) illustrates the memory cell array according to an embodiment of the present disclosure.

Refer to FIG. 2(A) and FIG. 2(B), FIG. 2(A) depicts the memory cells in the memory cell array 200 of FIG. 1. According to an embodiment of the present disclosure, the memory cell array 200 of ReRAM shown in FIG. 2(A) includes the bit lines $BL_0 \sim BL_V$ crossing the word lines $WL_0 \sim WL_u$ and the source lines $SL_0 \sim SL_{u/8}$. In the embodiment, the computational MAC result (multiply-and-accumulate value, MACV) of each bit line $BL_j$ of the memory cell array 200 is:

$$MACV = \sum_{i=0}^{u} INP_i * W_{ij} = \sum_{i=0}^{u} I_{MC\_ij} \qquad (1)$$

wherein $INP_i$ represents the input signal of the word line $WL_i$; $W_{ij}$ represents weight of the memory cell connecting to the word line $WL_i$ and the bit line $BL_j$; $I_{MC\_ij}$ represents the memory cell current of the memory cell connecting to the word line $WL_i$ and the bit line $BL_j$. Refer to FIG. 2(B), when the word line $WL_i$ is activated, the input signal $INP_i$ of the memory cell connecting to the word line $WL_i$ and the bit line $BL_j$ is equal to 1 ($INP_i=1$); when the word line $WL_i$ is not activated, the input signal $INP_i$ of the memory cell is equal to 0 ($INP_i=0$); if the memory cell is in the high resistive state (HRS), the weight of the memory cell connecting to the word line $WL_i$ and the bit line $BL_j$, which is denoted as $W_{ij}$, is equal to 0 ($W_{HRS}=0$); if the memory cell is in the low resistive state (LRS), $W_{ij}$ is equal to 1 ($W_{LRS}=1$). The MAC value of the bit line $BL_j$ represents the summation of the product of the input signal $INP_i$ and the weight $W_{ij}$ of each memory cell connecting to the bit line $BL_j$, as shown in Eq. (1). The MAC value of the bit line $BL_j$ also represents the summation of the memory cell current of each memory cell connecting to the bit line $BL_j$ according to Eq. (1). In other words, The MAC value of the bit line $BL_j$ means the bit line current of the bit line $BL_j$.

Figure 10:
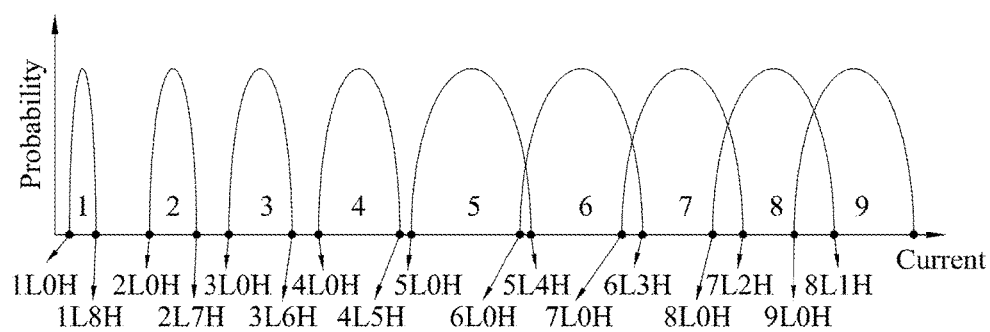
FIG. 10 illustrates the bit line current with different MACV.

However, refer to FIG. 2(B), the memory cells in the high resistive state each generates a leakage current even though the weight of a high resistive state cell is zero. The leakage currents of the high resistive state cells affect the MAC value and thus result in difficulty of correctly reading the MAC value of the bit line. That is, if the leakage current does not exist, people can judge the MAC value of a bit line through the bit current. However, the leakage current causes a current variation and increases a difficulty in judging the MAC value of the bit line. The foregoing influence becomes larger when more word lines are activated simultaneously, such as in the computing-in-memory approach. In detail, refer to FIG. 10, which illustrates the bit line currents of a memory array when the number of the word lines being activated is equal to 1~9. Each semi-elliptic-like curve represents bit line currents having the same MAC value. The number inside each semi-elliptic-like curves represents the corresponding MAC value. The point 6L3H, for example, indicates the bit line current of a bit line having 9 word lines being activated. Besides, 6 low resistive state cells and 3 high resistive state cells are connected to the 9 word lines, respectively. The point 7L0H, for example, indicates the bit line current of a bit line having 7 word lines being activated. Besides, 7 low resistive state cells and 0 high resistive state cells are connected to the 7 word lines, respectively. Ideally, if the leakage current does not exist, the bit line current (the MACV) of the point 7L0H would be higher than the bit line current (the MACV) of the point 6L3H because $W_{HRS}=0$ and $W_{LRS}=1$. However, since the existence of the leakage current, the bit line current of the point 6L3H exceeds the bit line current of the point 7L0H, as shown in FIG. 10. In this way, as shown in FIG. 10, those semi-elliptic-like curves overlap partially. Consequently, one bit line current may indicate two different MAC values, which leads to an error since the correct MAC value is not able to be identified according to the bit line current.

In order to solve the current variation problem in the MAC computation, a system which can properly distinguish candidates of the computational MAC (multiply-and-accumulate) result of each bit line of the memory cell array 200 under the existence of the leakage current is needed. The present disclosure thus provides the input-pattern aware reference generation system to generate reference signals for properly distinguish candidates of the computational result of each bit line so as to correctly judge the MACV of each bit line of the memory cell 200.

Hereinafter, the generation of the reference signals for distinguishing candidates of the computational MAC (multiply-and-accumulate) result of each bit line of the memory cell array 200 will be described in detail.

According to an embodiment of the present disclosure, refer to FIG. 1 and FIG. 2, the input counting circuit 101 is electrically connected to the word line driver 300 (not shown) for receiving the input signal INP such that the number of word lines of the memory cell array 200 being activated through the input signal INP is sensed.

The reference array 103 is arranged on a host memory cell array 104 and includes at least one reference sub-array. Each reference sub-array has a plurality of reference memory cells. Furthermore, each of the reference memory cells is a binary resistor which is configured in the low resistive state (LRS) or in the high resistive state (HRS) in advance.

According to an embodiment of the present disclosure, the table in FIG. 1 shows an exemplary resistor configuration of the reference memory cells in a reference sub-array. However, the present disclosure should not be limited to this and the resistor configuration may be different, that is, the number of the reference bit lines in the reference sub-array can be arbitrary such as an arbitrary number n. In the table of FIG. 1, the character "L" represents a reference memory cell in the low resistive state (LRS) and the character "H" represents a reference memory cell in the high resistive state (HRS). Memory cells of LRS represent the data values (weights) of 1's are stored, and memory cells of HRS represent the data values of 0's are stored. According to the embodiment, the reference sub-array includes m+1 reference word lines $RWL_0 \sim RWL_m$ and eight reference bit lines RBL0~RBL7.

It should be noted that the number of the reference bit lines in each reference sub-array may be arbitrary rather than 8 illustrated in the embodiment of the present disclosure. Similarly, the number of the reference sub-arrays in the reference array 103 may be arbitrary as well.

Refer to FIG. 1, the reference word line control circuit 102 is electrically connected between the input counting circuit 101 and the reference array 103 so as to control the reference array 103 according to a number signal NWL received by the input counting circuit 101.

Figure 3:
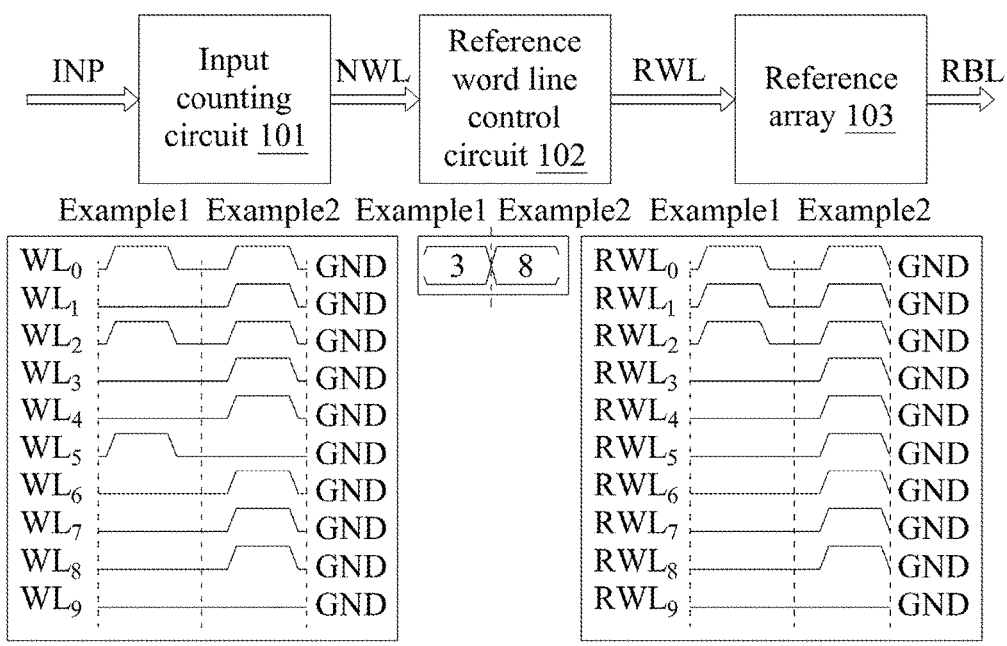
FIG. 3 illustrates the method of controlling the reference array through the reference word line control circuit.

Refer to FIG. 3, which illustrates the method of controlling the reference array 103 through the reference word line control circuit 102. In FIG. 3, the input counting circuit 101 of the present embodiment shown in FIG. 1 receives the input signal INP and generates a number signal NWL according to the input signal INP, wherein the number signal NWL represents the number of word lines which are activated in the memory cell array 200. Take the embodiment having the memory cell array illustrated in FIG. 2(A) as an example, when the word lines $WL_0$, $WL_2$ and $WL_5$ are activated, the corresponding number signal NWL is equal to 3, as shown in Example 1 of FIG. 3; when the word lines $WL_0$, $WL_1$, $WL_2$, $WL_3$, $WL_4$, $WL_6$, $WL_R$ and $WL_8$ are activated, the number signal NWL is equal to 8, as shown in Example 2 of FIG. 3.

According to the present embodiment, after receiving the number signal NSL, the reference word line control circuit 102 then activates reference word lines RWL of each reference sub-array according to the number signal NSL. In Example 1 of FIG. 3, since the number signal NWL is equal to 3, first 3 reference word lines $RWL_0 \sim RWL_2$ are then activated; in Example 2 of FIG. 3, since the number signal NWL is equal to 8, first 8 reference word lines $RWL_0 \sim RWL_7$ are then activated. That is, in general, when the number signal is equal to k, first k reference word lines of each reference sub-array will then be activated.

After the foregoing reference word lines are activated, each reference sub-array generates a plurality of reference signals. According to an embodiment having the reference sub-array with the resistor configuration shown in the table of FIG. 1, each of the 8 reference bit lines RBL0~RBL7 generates a reference signal.

According to Eq. (1), each reference signal of the reference bit lines RBL0-RBL7 is the summation of the memory cell currents of the reference memory cells connecting to the corresponding reference bit line, respectively. That is, each reference signal is the reference bit line current of the corresponding reference bit line (hereinafter, the reference signal is referred as the reference bit line current). For, example, the reference bit line current of the reference bit line RBL3 is the summation of the memory cell currents of three low resistive state memory cells and two high resistive state memory cells when the number signal NWL is equal to 5 in the present embodiment. In other words, the reference bit line current of the reference bit line RBL3 (hereinafter, denoted as $I_{RBL3}$) is the computational MAC result of three H's (weight=0) and two L's (weight=1) when the number signal NWL is equal to 5. In the meantime, when the number signal NWL is equal to 5, the reference bit line current of the reference bit line RBL0 (hereinafter, denoted as $I_{RBL0}$) is the computational MAC result of five H's; the reference bit line current of the reference bit line RBL1 (hereinafter, denoted as $I_{RBL1}$) is the computational MAC result of four H's and one L; the reference bit line current of the reference bit line RBL2 (hereinafter, denoted as $I_{RBL2}$) is the computational MAC result of three H's and two L's; the reference bit line current of the reference bit line RBL4 (hereinafter, denoted as $I_{RBL4}$) is the computational MAC result of one H and four L's; the reference bit line current of each reference bit lines RBL5~RBL7 (hereinafter, denoted as $I_{RBL5} \sim I_{RBL7}$) is the computational MAC result of five L's.

After being generated, eight reference bit line currents are then selectively transmitted to the multi-level sensing current sense amplifier 400 through the multiplexer 500 connecting to the reference sub-array, as shown in FIG. 1. Besides, the bit line current which is going to be analyzed is transmitted to the multi-level sensing current sense amplifier 400 through the data line DL by the multiplexer 600. The reference bit line currents and the bit line current transmitted to the multi-level sensing current sense amplifier 400 will be properly analyzed for judging the MAC value (MACV) of the bit line current.

Figure 4:
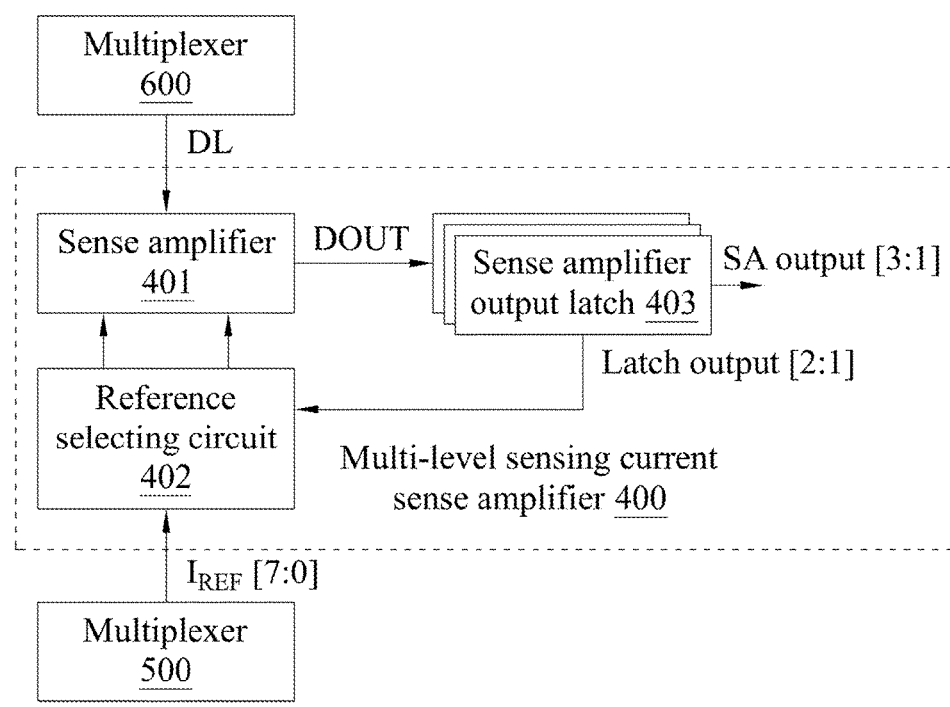
FIG. 4 depicts the block diagram of the multi-level sensing current sense amplifier according to an embodiment of the present disclosure.

Hereinafter, the comparison process for judging the MACV of the bit line current is discussed:

Refer to FIG. 4, which depicts the block diagram of the multi-level sensing current sense amplifier 400 according to an embodiment of the present invention. According to an embodiment of the present invention, as mentioned in FIG. 1, eight reference bit line currents are transmitted to the multi-level sensing current sense amplifier 400 through the multiplexer 500 connecting to the reference sub-array, as shown in FIG. 1. Those eight reference bit line currents are denoted as $I_{REF}$ [7:0] in FIG. 4. The multi-level sensing current sense amplifier 400 includes the sense amplifier 401, the reference selecting circuit 402 and the sense amplifier output latch 403. The sense amplifier 401 is electrically connected to the multiplexer 600 which provides the bit line current through the data line DL. The reference selecting circuit 402 is electrically connected between the reference array 103 and the sense amplifier 401 for selecting and transmitting one or more reference bit line currents to the sense amplifier 401. The sense amplifier output latch 403 is electrically connected between the sense amplifier 401 and the reference selecting circuit 402. The sense amplifier output latch 403 is configured to not only send a feedback to the reference selecting circuit 402 for selecting other reference bit line currents for further comparison until the MACV of the bit line current being found, but also output the MACV of the bit line (SA output).

In some embodiments of the present disclosure, only one of the eight reference bit line currents is selected to compare with the bit line current each time, while in some embodiments, two of the eight reference bit line currents are simultaneously selected each time. However, the present disclosure should not be limit to this. The number of the selected reference bit line currents may be arbitrary.

Figure 5:
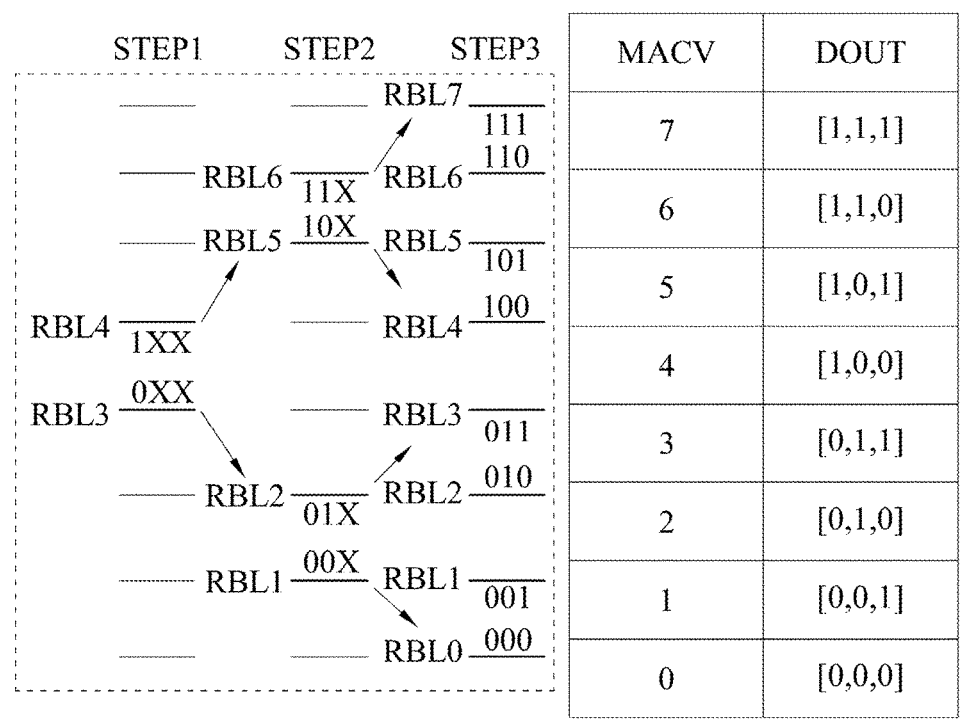
FIG. 5 illustrates the method of comparing the bit line current with reference bit line currents according to an embodiment of the present disclosure.

Refer to FIG. 4 and FIG. 5, FIG. 5 illustrates the method of comparing the bit line current with two reference bit line currents in the sense amplifier 401 of FIG. 4. In STEP 1, the reference bit line currents of reference bit lines RBL3 and RBL4 are applied. The comparison result of STEP 1 is then transmitted to the sense amplifier output latch 403. The sense amplifier output latch 403 outputs a corresponding feedback to the reference selecting circuit 402 to choose another two reference bit line currents such as the reference bit line currents of reference bit lines RBL1 and RBL2 or of reference bit lines RBL5 and RBL6 in the present embodiment. The selected reference bit line currents are then transmitted to the sense amplifier 401 for further precise comparison in STEP 2. If the selected reference bit line currents in STEP 2 are of reference bit lines RBL1 and RBL2, another two reference bit line currents in STEP 3 will be of reference bit lines RBL0 and RBL1 or of reference bit lines RBL2 and RBL3. If the selected reference bit line currents in STEP 2 are of reference bit lines RBL5 and RBL6, another two reference bit line currents in STEP 3 will be of reference bit lines RBL4 and RBL5 or of reference bit lines RBL6 and RBL7. After the sense amplifier 401 proceeds STEP 1~STEP 3, the sense amplifier output latch 403 outputs the MACV of the bit line current according to the table in FIG. 5.

Figure 6A:
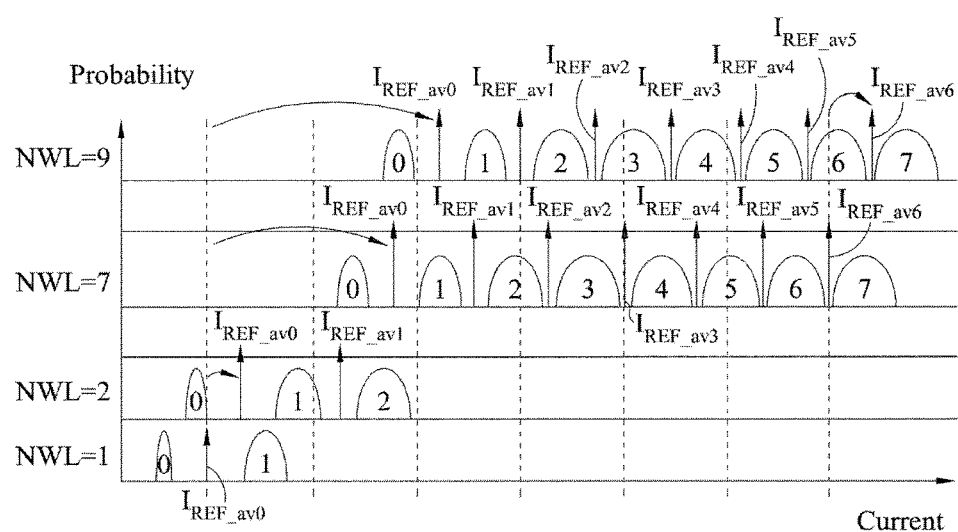
FIG. 6(A) illustrates the concept of distinguishing the candidates of the computational MAC result of the bit line according to an embodiment of the present disclosure.
Figure 6B:
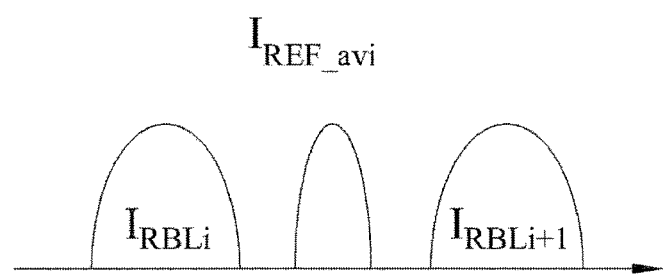
FIG. 6(B) illustrates the concept of averaging each two reference bit line currents which are closest to each other in a reference bit line current set.

In some embodiments of the present disclosure, an average value of two reference bit line currents is used each time. Refer to FIG. 6(A), which illustrates the concept of distinguishing the candidates of the computational MAC result of the bit line according to an embodiment of the present disclosure. That is, with the arrangement of the reference bit line currents of the reference bit lines RBL0~RBL7 from the lowest reference bit line current to the highest reference bit line current in a reference bit line current set, each two reference bit line currents which are closest to each other (neighboring outputs) in the reference bit line current set are averaged (summed and divided by 2), as shown in FIG. 6(B). In FIG. 6(B), the width of the reference bit line currents $I_{RBLi}$ and $I_{RBLi+1}$ is due to the process variation, which results in a width of the corresponding average value $T_{REF\_avi}$. In the embodiment having the reference sub-array with the resistor configuration shown in the table of FIG. 1, the average values $I_{REF\_avi}$ among $I_{REF\_av0}$-$I_{REF\_av6}$ are:

$$I_{REF\_av0}=(I_{RBL0}+I_{RBL1})/2 \quad (2)$$

$$I_{REF\_av1}=(I_{RBL1}+I_{RBL2})/2 \quad (3)$$

$$I_{REF\_av2}=(I_{RBL2}+I_{RBL3})/2 \quad (4)$$

$$I_{REF\_av3}=(I_{RBL3}+I_{RBL4})/2 \quad (5)$$

$$I_{REF\_av4}=(I_{RBL4}+I_{RBL5})/2 \quad (6)$$

$$I_{REF\_av5}=(I_{RBL5}+I_{RBL6})/2 \quad (7)$$

$$I_{REF\_av6}=(I_{RBL6}+I_{RBL7})/2 \quad (8)$$

It should be noted that those average values are depicted as an up-pointing arrow in FIG. 6(A) and the width of each average values is omitted for the purpose of clarity:

According to the embodiment having the reference array 103 with the resistor configuration shown in the table of FIG. 1, when the number signal NWL is equal to 1, $I_{RBL0}$ is the computational MAC result of one H and each $I_{RBL1}$-$I_{RBL7}$ is the computational MAC result of one L. In this way, Eq. (2)-Eq. (8) become:

$$I_{REF\_av0}=(I_{HRS}+I_{LRS})/2$$

$$I_{REF\_av1}=(I_{LRS}+I_{LRS})/2$$

$$I_{REF\_av2}=(I_{LRS}+I_{LRS})/2$$

$$I_{REF\_av3}=(I_{LRS}+I_{LRS})/2$$

$$I_{REF\_av4}=(I_{LRS}+I_{LRS})/2$$

$$I_{REF\_av5}=(I_{LRS}+I_{LRS})/2$$

$$I_{REF\_av6}=(I_{LRS}+I_{LRS})/2$$

Wherein $I_{HRS}$ represents memory cell current of a memory cell in the high resistive state and $I_{LRS}$ represents memory cell current of a memory cell in the low resistive state.

Furthermore, only the average values of each two reference bit line currents which are closest to each other and different from each other in the reference bit line current set are denoted as an up-pointing arrow in FIG. 6(A). That is, when NSL=1, $I_{REF\_av1}$-$I_{REF\_av6}$ are not shown in FIG. 6(A) and $I_{REF\_av0}$ is denoted as the only one arrow.

Similarly, when the number signal NWL is equal to 2, Eq. (2)-Eq. (8) become:

$$I_{REF\_av0}=(2I_{HRS}+(I_{LRS}+I_{HRS}))/2$$

$$I_{REF\_av1}=((I_{LRS}+I_{HRS})+2I_{LRS})/2$$

$$I_{REF\_av2}=(2I_{LRS}+2I_{LRS})/2$$

$$I_{REF\_av3}=(2I_{LRS}+2I_{LRS})/2$$

$$I_{REF\_av4}=(2I_{LRS}+2I_{LRS})/2$$

$$I_{REF\_av5}=(2I_{LRS}+2I_{LRS})/2$$

$$I_{REF\_av6}=(2I_{LRS}+2I_{LRS})/2$$

wherein only $I_{REF\_av0}$ and $I_{REF\_av1}$ are both denoted as an up-pointing arrow when NSL=2 in FIG. 6(A) according to the principle being said above.

Similarly, when the number signal NWL is equal to 7, Eq. (2)-Eq. (8) become:

$$I_{REF\_av0}=(7I_{HRS}+(6I_{HRS}+I_{LRS}))/2$$

$$I_{REF\_av1}=((6I_{HRS}+I_{LRS})+(5I_{HRS}+2I_{LRS}))/2$$

$$I_{REF\_av2}=((5I_{HRS}+2I_{LRS})+(4I_{HRS}+3I_{LRS}))/2$$

$$I_{REF\_av3}=((4I_{HRS}+3I_{LRS})+(3I_{HRS}+4I_{LRS}))/2$$

$$I_{REF\_av4}=((3I_{HRS}+4I_{LRS})+(2I_{HRS}+5I_{LRS}))/2$$

$$I_{REF\_av5}=((2I_{HRS}+5I_{LRS})+(I_{HRS}+6I_{LRS}))/2$$

$$I_{REF\_av6}=((I_{HRS}+6I_{LRS})+(7I_{LRS}))/2$$

wherein $I_{REF\_av0}$-$I_{REF\_av6}$ are all denoted as an up-pointing arrow when NSL=7 in FIG. 6(A).

Similarly, when the number signal NWL is equal to 9, Eq. (2)-Eq. (8) become:

$$I_{REF\_av0}=(9I_{HRS}+(8I_{HRS}+I_{LRS}))/2$$

$$I_{REF\_av1}=((8I_{HRS}+I_{LRS})+(7I_{HRS}+2I_{LRS}))/2$$

$$I_{REF\_av2}=((7I_{HRS}+2I_{LRS})+(6I_{HRS}+3I_{LRS}))/2$$

$$I_{REF\_av3}==((6I_{HRS}+3I_{LRS})+(5I_{HRS}+4I_{LRS}))/2$$

$$I_{REF\_av4}=((5I_{HRS}+4I_{LRS})+(4I_{HRS}+5I_{LRS}))/2$$

$$I_{REF\_av5}=((4I_{HRS}+5I_{LRS})+(3I_{HRS}+6I_{LRS}))/2$$

$$I_{REF\_av6}=((3I_{HRS}+6I_{LRS})+(2I_{HRS}+7I_{LRS}))/2$$

wherein $I_{REF\_av0}$-$I_{REF\_av6}$ are all denoted as an up-pointing arrow when NSL=9 in FIG. 6(A).

Refer to FIG. 6(A) and Eq. (1), those semi-elliptic-like curves each represents the candidate of the bit line current having different MAC value. Each candidate is in the position between two average values according to a simulation of the present disclosure. Those candidates of the bit line current are denoted as a probability distribution having a width due to the process variation. The number inside each semi-elliptic-like curves represents the corresponding MAC value. According to Eq. (1), the leakage current of each high resistive state cell result in a current variation in the MACV computation. For example, when NSL=7 in FIG. 6(A), the number of the low resistive state cell is zero and the number of the high resistive state cell is 7 for MACV=0. Those 7 high resistive state cells produce leakage currents, which results in a certain amount of current variation (the distance between the MACV=0 curve and the y-axis (current=0)) shown when NSL=7 in FIG. 6(A). Further, when NSL=9 in FIG. 6(A), the number of the low resistive state cell is zero and the number of the high resistive state cell is 9 for MACV=0. Those 9 high resistive state cells produce leakage currents, which results in a larger amount of current variation (the distance between the MACV=0 curve and the y-axis (current=0)) shown when NSL=9 in FIG. 6(A).

The average values of the reference bit line currents include the leakage currents of the high resistive state cells of each reference sub-array, which means that those average values (those up-pointing arrows in FIG. 6(A)) of the input-pattern aware reference generation system have taken the leakage current effect into account and can thus properly distinguish the candidates of the bit line currents in comparison with the conventional reference bit line currents (fixed reference bit line current, those dotted lines in FIG. 6(A)) under the current variation problem.

Figure 7:
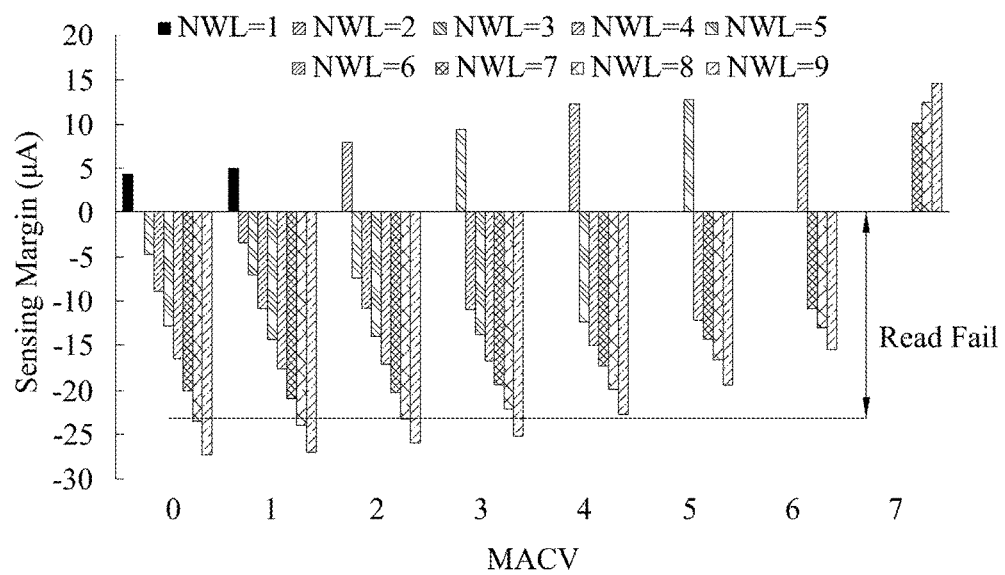
FIG. 7 depicts the sensing margin of different input signals in the conventional reference bit line current scheme according to an embodiment of the present disclosure.
Figure 8:
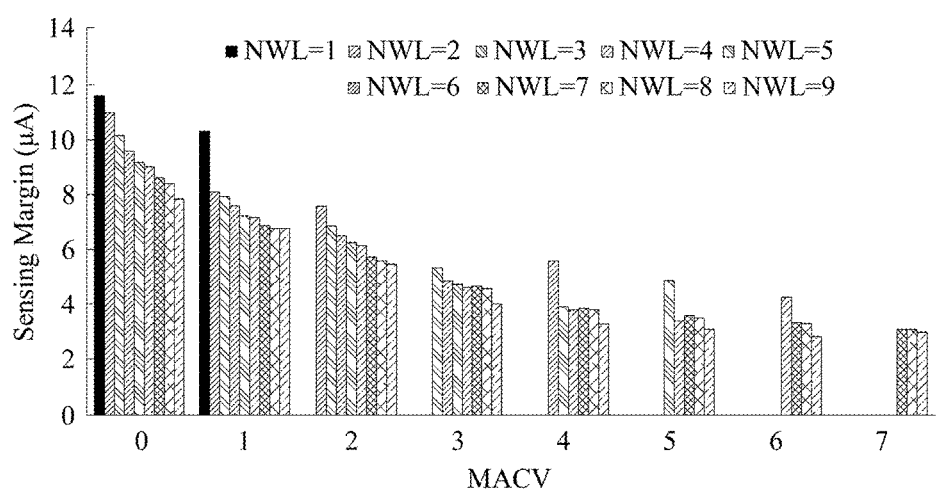
FIG. 8 depicts the sensing margin of different input signals in the input-pattern aware reference generation system according to an embodiment of the present disclosure.

Refer to FIG. 7 and FIG. 8, FIG. 7 depicts the sensing margin of the bit line currents having different number signal NWL in the conventional reference bit line current scheme and FIG. 8 depicts the sensing margin of the bit line currents having different number signal NWL in the input-pattern aware reference generation system of the present disclosure. Since fixed reference bit line currents cannot properly distinguish the candidates of the bit line currents, as shown in FIG. 6(A), only few data of the bit line currents can be read in FIG. 7. On the contrary, since the input-pattern aware reference generation system can properly distinguish the candidates of the bit line currents, as shown in FIG. 6(A), the sensing margin of each bit line current has a significant improvement in FIG. 8.

Figure 9:
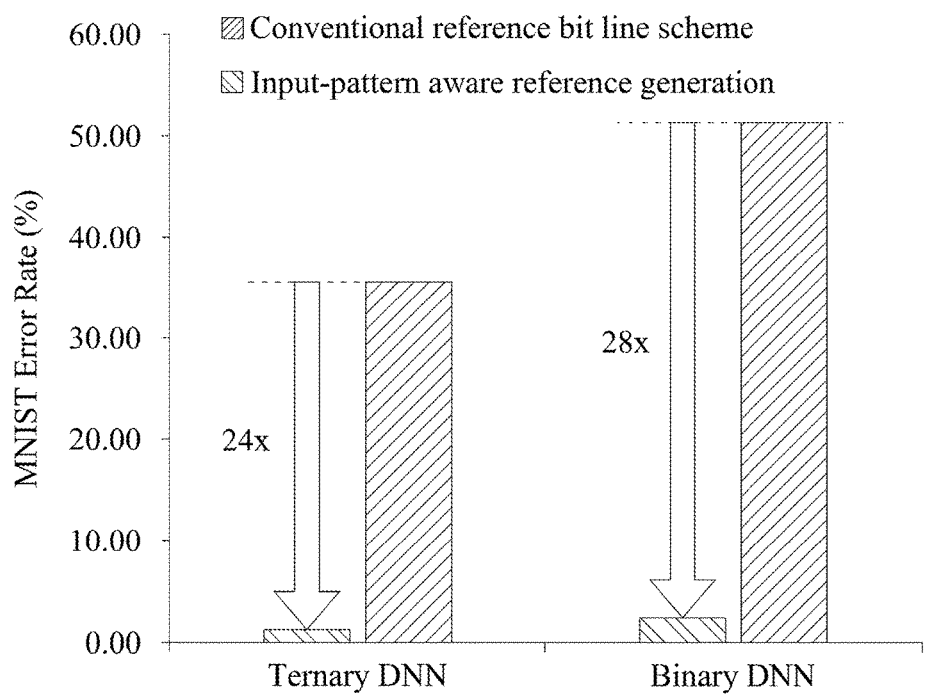
FIG. 9 depicts the MNIST error rate of the input-pattern aware reference generation system in comparison with the conventional reference bit line current scheme according to an embodiment of the present disclosure.

Refer to FIG. 9, which depicts the MNIST error rate of the input-pattern aware reference generation system in comparison with the conventional reference bit line current scheme. A significant improvement is shown in both the ternary DNN (deep neural networks) and the binary DNN.

In accordance with the above description, the input-pattern aware reference generation system can properly distinguish candidates of the bit line current and further increase the sensing margin and improve the sensing yield in comparison with the conventional reference bit line current scheme.

The above description is merely illustrative and not restrictive. Any equivalent modification or change without departing from the spirit and scope of the present disclosure should be included in the appended claims.

What is claimed is:

1. An input-pattern aware reference generation system for a memory cell array having a plurality of word lines crossing a plurality of bit lines, the plurality of word lines being selectively activated by an input signal such that each of the plurality of bit lines generates a computational result of multiply-and-accumulate (MAC) computation, the system comprising:
    an input counting circuit, receiving the input signal of the memory cell array, discovering input activated word lines according to the input signal and generating a number signal representing a number of the input activated word lines;
    a reference array, comprising a plurality of reference memory cells storing a predetermined set of weights; and
    a reference word line control circuit, electrically connected between the input counting circuit and the reference array, the reference word line control circuit controlling the reference array to generate a plurality of reference signals being able to distinguish candidates of the computational result of the bit lines in the memory cell array according to the number signal.

2. The system of claim 1, wherein the reference array comprises a plurality of reference bit lines, and the predetermined set of weights is arranged such that the plurality of reference bit lines each represents a possible MAC computational result of a combination of 0's and 1's stored in each memory cell of the memory cell array.

3. The system of claim 2, wherein the plurality of reference signals are selected according to outputs of the reference bit lines.

4. The system of claim 3, wherein the plurality of reference signals each represents an average of two neighboring outputs of the reference bit lines.

5. The system of claim 1, wherein the reference array comprises one or more reference sub-array and each of the reference sub-arrays comprises m reference word lines crossing n reference bit lines; wherein when the number signal is q, q reference word lines among m reference word lines are activated according to the input signal, the n reference bit lines generate at least q+1 MAC computational results corresponding to combinations of r 1's and s 0's, wherein m, n, and q are integers, $0 \leq r$, $s \leq q$, and $r+s=q$.

6. The system of claim 1, wherein the reference signals are voltage signals or current signals.

7. The system of claim 1, wherein the memory cell array is a non-volatile memory (NVM) used in a computing-in-memory (CIM) application.

8. A system for computing-in-memory approach, comprising:
   a memory cell array having a plurality of word lines crossing a plurality of bit lines, the plurality of word lines being selectively activated by an input signal such that each of the plurality of bit lines generates a computational result of multiply-and-accumulate (MAC) computation;
   an input-pattern aware reference generation circuit, comprising:
      an input counting circuit, receiving the input signal of the memory cell array, and discovering input activated word lines according to the input signal and generating a number signal representing a number of input activated word lines;
      a reference array, comprising a plurality of reference memory cells storing a predetermined set of weights; and
      a reference word line control circuit, electrically connected between the input counting circuit and the reference array, the reference word line control circuit controlling the reference array to generate a plurality of reference signals being able to distinguish candidates of the computational result of the bit lines in the memory cell array according to the number signal; and
   a multi-level sensing current sense amplifier comprising:
      a sense amplifier, electrically connected to the memory cell array;
      a reference selecting circuit, electrically connected between the reference array and the sense amplifier, the reference selecting circuit selecting and transmitting at least one of the reference signals to the sense amplifier; and
      a sense amplifier output latch, electrically connected between the sense amplifier and the reference selecting circuit, the sense amplifier output latch matching the computational result of the bit lines with the candidates and outputting a matched computational result of the bit lines.

9. The system of claim 8, wherein the reference array comprise a plurality of reference bit lines, and the predetermined set of weights is arranged such that the plurality of reference bit lines each represents a possible MAC computational result of a combination of 0's and 1's stored in each memory cell of the memory cell array.

10. The system of claim 9, wherein the plurality of reference signals are selected according to outputs of the reference bit lines.

11. The system of claim 10, wherein the plurality of reference signals each represents an average of two neighboring outputs of the reference bit lines.

12. The system of claim 8, wherein the reference array comprises one or more reference sub-array and each of the reference sub-arrays comprises m reference word lines crossing n reference bit lines; wherein when the number signal is q, q reference word lines among m reference word lines are activated according to the input signal, the n reference bit lines generate at least q+1 MAC computational results corresponding to combinations of r 1's and s 0's, wherein m, n, and q are integers, $0 \leq r$, $s \leq q$, and $r+s=q$.

13. The system of claim 8, wherein the reference signals are voltage signals or current signals.

14. The system of claim 8, wherein the memory cell array is a non-volatile memory (NVM).

* * * * *